United States Patent

Takeshima

(10) Patent No.: US 11,906,609 B2
(45) Date of Patent: Feb. 20, 2024

(54) IMAGE RECONSTRUCTION APPARATUS

(71) Applicant: CANON MEDICAL SYSTEMS CORPORATION, Otawara (JP)

(72) Inventor: Hidenori Takeshima, Kawasaki (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 326 days.

(21) Appl. No.: 17/128,476

(22) Filed: Dec. 21, 2020

(65) Prior Publication Data

US 2021/0247477 A1     Aug. 12, 2021

(30) Foreign Application Priority Data

Feb. 12, 2020    (JP) .................................. 2020-021186

(51) Int. Cl.
| | |
|---|---|
| *G01R 33/561* | (2006.01) |
| *G06T 11/00* | (2006.01) |
| *G01R 33/563* | (2006.01) |
| *G06T 7/00* | (2017.01) |

(52) U.S. Cl.
CPC ...... *G01R 33/5611* (2013.01); *G01R 33/5635* (2013.01); *G06T 7/0012* (2013.01); *G06T 11/006* (2013.01); *G06T 2207/10088* (2013.01)

(58) Field of Classification Search
CPC ........................... G01R 33/5611; G06T 7/0012
See application file for complete search history.

(56) References Cited

U.S. PATENT DOCUMENTS

| | | | |
|---|---|---|---|
| 7,005,853 B2 * | 2/2006 | Tsao | G01R 33/5611 324/309 |
| 8,948,536 B2 | 2/2015 | Boernert et al. | |
| 9,304,180 B2 | 4/2016 | Schmitt | |
| 9,390,521 B2 | 7/2016 | Lin et al. | |
| 9,429,636 B2 | 8/2016 | Ivancevic et al. | |
| 9,733,328 B2 * | 8/2017 | Doneva | G01R 33/543 |
| 10,229,515 B2 | 3/2019 | Ohishi | |
| 2008/0068014 A1 * | 3/2008 | Dannels | G01R 33/561 702/57 |

(Continued)

FOREIGN PATENT DOCUMENTS

| | | | |
|---|---|---|---|
| JP | 6-343621 A | 12/1994 | |
| WO | WO-2018187005 A1 * | 10/2018 | G01R 33/482 |

OTHER PUBLICATIONS

Huang, F., Akao, J., Vijayakumar, S., Duensing, G.R. and Limkeman, M. (2005), k-t GRAPPA: A k-space implementation for dynamic MRI with high reduction factor. Magn. Reson. Med., 54: 1172-1184. https://doi.org/10.1002/mrm.20641 (Year: 2005).*

(Continued)

*Primary Examiner* — Aaron W Carter
*Assistant Examiner* — Courtney Joan Nelson
(74) *Attorney, Agent, or Firm* — Oblon, McClelland, Maier & Neustadt, L.L.P.

(57) ABSTRACT

An image reconstruction apparatus according to an embodiment includes a processing circuitry configured to reconstruct at least one image from a plurality of pieces of k-space data acquired in a time direction. The processing circuitry performs image estimation calculation that reconstructs estimated images sharing the k-space data in the time direction, and adaptation calculation that adapts the estimated images to prior knowledge in the time direction.

6 Claims, 3 Drawing Sheets

(56) References Cited

U.S. PATENT DOCUMENTS

| | | |
|---|---|---|
| 2008/0219535 A1 | 9/2008 | Mistretta et al. |
| 2013/0089271 A1 | 4/2013 | Boernert et al. |
| 2013/0315461 A1 | 11/2013 | Zhao et al. |
| 2014/0086469 A1 | 3/2014 | Lefebvre et al. |
| 2015/0282719 A1* | 10/2015 | Fielden ............... A61B 5/0263 600/419 |
| 2015/0346303 A1 | 12/2015 | Hu et al. |
| 2017/0035319 A1 | 2/2017 | Zhao et al. |

OTHER PUBLICATIONS

YANG, Y. et al., "Deep ADMM-Net for Compressive Sensing MRI," $30^{th}$ Conference on Neural Information Processing Systems (NIPS 2016), Dec. 5-10, 2016, 9 pages.

"Solve Constrained Nonlinear Optimization, Problem-Based," https://jp.mathworks.com/help/optim/ug/solve-constrained-nonlinear-optimization-problem-based.html, retrieved Oct. 3, 2019, 6 pages (with English translation).

Japanese Notice of Reasons for Refusal dated Jun. 13, 2023, issued in Japanese Patent Application No. 2020-021186, 4 pages.

Japanese Notice of Reasons for Refusal dated Nov. 7, 2023, in Japanese Patent Application No. 2020-021186, 3 pages.

* cited by examiner

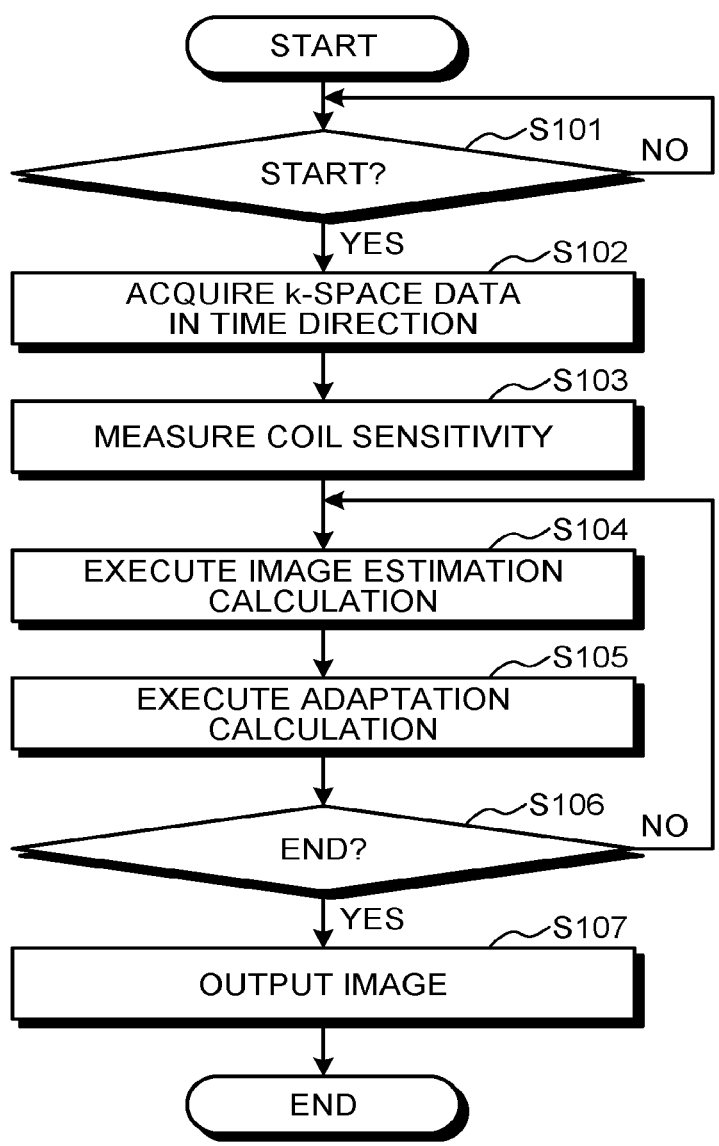

IMAGE RECONSTRUCTION APPARATUS

CROSS-REFERENCE TO RELATED APPLICATIONS

This application is based upon and claims the benefit of priority from Japanese Patent Application No. 2020-021186, filed on Feb. 12, 2020; the entire contents of which are incorporated herein by reference.

FIELD

Embodiments described herein relate generally to an image reconstruction apparatus.

BACKGROUND

In a conventionally known method of producing a moving image through a magnetic resonance imaging (MRI) apparatus, for example, k-space data is continuously acquired in the time direction and an image of one frame is reconstructed for each predetermined number of readouts by using the acquired k-space data. In this method, the image quality of the reconstructed image can be improved by increasing the number of readouts serving as the unit of image reconstruction, but a larger number of pieces of k-space data are needed to maintain the number of frames, which causes a problem such as an increased imaging time.

To avoid this, a technology called a time-domain constraint is known as a method of improving the image quality of the reconstructed image without increasing the number of readouts serving as the unit of image reconstruction. The time-domain constraint is a technology of removing noise in the time direction by adapting reconstructed temporally sequential images to prior knowledge in the time direction. For example, a method of using compression sensing is known as an exemplary time-domain constraint.

However, the time-domain constraint is processing performed on the reconstructed image, and thus the image quality cannot be sufficiently improved sometimes when the amount of k-space data allocated to an image of one frame is small.

BRIEF DESCRIPTION OF THE DRAWINGS

FIG. 4 is a flowchart illustrating the procedure of imaging processing performed by the MRI apparatus according to the present embodiment.

DETAILED DESCRIPTION

An image reconstruction apparatus according to an embodiment includes a reconstruction unit configured to reconstruct at least one image from a plurality of pieces of k-space data acquired in a time direction. The reconstruction unit performs image estimation calculation that reconstructs estimated images sharing k-space data in the time direction, and adaptation calculation that adapts the estimated images to prior knowledge in the time direction.

The embodiment of an image reconstruction apparatus according to the present application will be described below in detail with reference to the accompanying drawings. The following description will be made on an example in which the image reconstruction apparatus according to the present application is applied to MRI apparatus.

Figure 1:
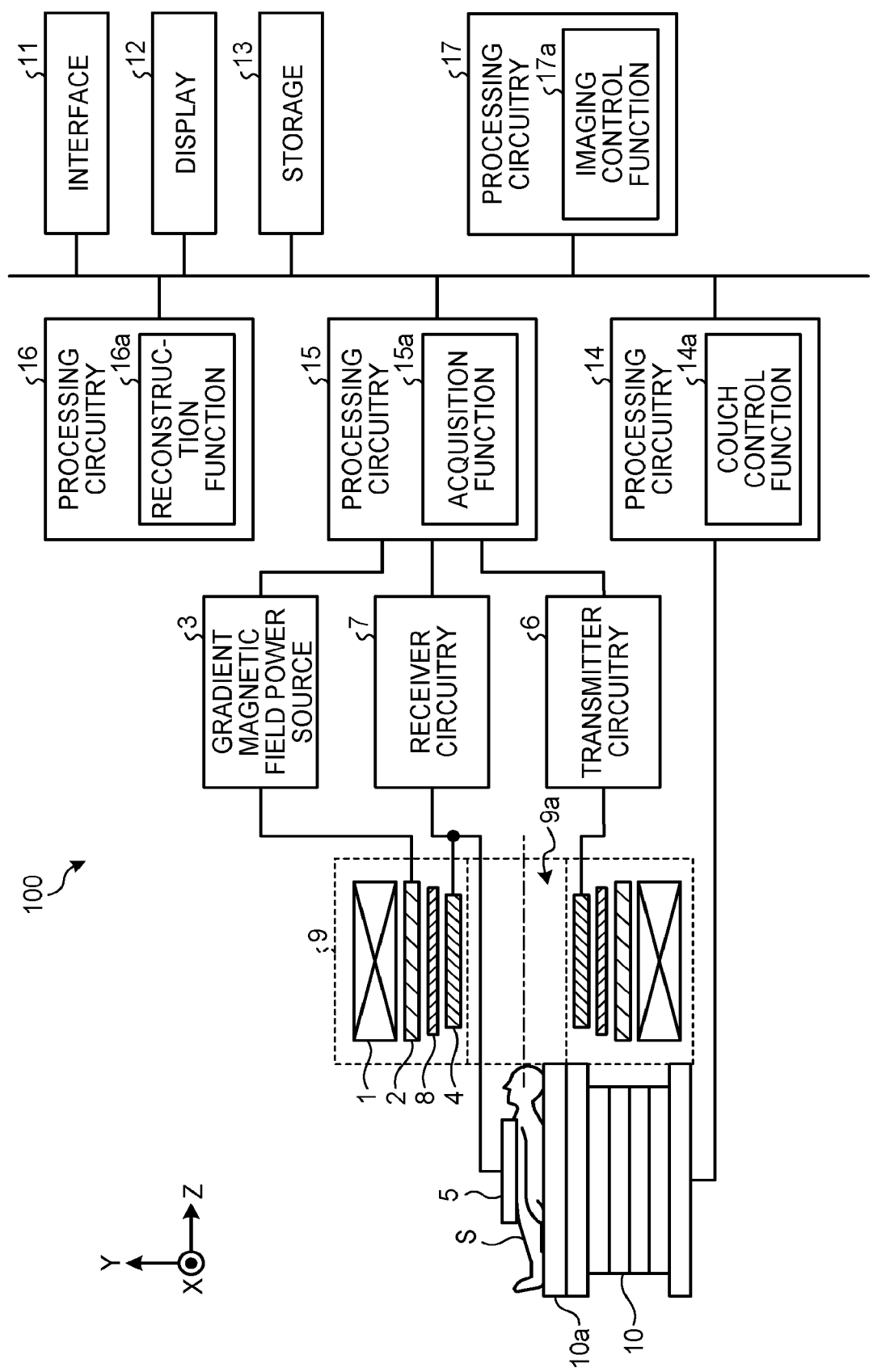
FIG. 1 is a diagram illustrating an exemplary configuration of an MRI apparatus according to the present embodiment.

FIG. 1 is a diagram illustrating an exemplary configuration of an MRI apparatus according to the present embodiment.

For example, as illustrated in FIG. 1, this MRI apparatus 100 includes a static magnetic field magnet 1, a gradient coil 2, a gradient magnetic field power source 3, a whole-body RF coil 4, a local RF coil 5, a transmitter circuitry 6, a receiver circuitry 7, a radio frequency (RF) shield 8, a mount 9, a couch 10, an interface 11, a display 12, a storage 13, and processing circuitries 14 to 16.

The static magnetic field magnet 1 generates a static magnetic field in an imaging space in which a subject S is placed. Specifically, the static magnetic field magnet 1 is formed in a hollow substantially cylindrical shape (including that having an elliptical sectional shape orthogonal to the central axis) and generates a static magnetic field in an imaging space formed on the inner periphery side. For example, the static magnetic field magnet 1 is a superconductive magnet or a permanent magnet. The superconductive magnet is constituted of, for example, a container filled with a cooling agent such as liquid helium and a superconductive coil immersed in the container.

The gradient coil 2 is disposed inside the static magnetic field magnet 1 and generates a gradient magnetic field in the imaging space in which the subject S is placed. Specifically, the gradient coil 2 is formed in a hollow substantially cylindrical shape (including that having an elliptical sectional shape orthogonal to the central axis) and includes an X coil, a Y coil, and a Z coil corresponding to an X axis, a Y axis, and a Z axis, respectively, that are orthogonal to each other. The X coil, the Y coil, and the Z coil each generate, in the imaging space, a gradient magnetic field that linearly changes in the corresponding axial direction based on a current supplied from the gradient magnetic field power source 3. The Z axis is set to be along the magnetic flux of the static magnetic field generated by the static magnetic field magnet 1. The X axis is set to be in a horizontal direction orthogonal to the Z axis, and the Y axis is set to be in a vertical direction orthogonal to the Z axis. Accordingly, the X axis, the Y axis, and the Z axis form a device coordinate system unique to the MRI apparatus 100.

The gradient magnetic field power source 3 supplies current to the gradient coil 2 to generate a gradient magnetic field in the imaging space. Specifically, the gradient magnetic field power source 3 individually supplies current to each of the X coil, the Y coil, and the Z coil of the gradient coil 2 to generate, in the imaging space, a gradient magnetic field that linearly changes in the corresponding one of a readout direction, a phase encoding direction, and a slice direction, respectively, orthogonal to each other. Hereinafter, the gradient magnetic field in the readout direction is referred to as a readout gradient magnetic field, the gradient magnetic field in the phase encoding direction is referred to as a phase encoding gradient magnetic field, and the gradient magnetic field in the slice direction is referred to as a slice gradient magnetic field.

The readout gradient magnetic field, the phase encoding gradient magnetic field, and the slice gradient magnetic field are each superimposed on the static magnetic field generated by the static magnetic field magnet 1 to apply spatial position information to a magnetic resonance signal generated from the subject S. Specifically, the readout gradient magnetic field applies position information in the readout direction to the magnetic resonance signal by changing the frequency of the magnetic resonance signal in accordance with the position in the readout direction. The phase encoding gradient magnetic field applies position information in the phase encoding direction to the magnetic resonance signal by changing the phase of the magnetic resonance signal in the phase encoding direction. The slice gradient magnetic field applies position information in the slice direction to the magnetic resonance signal. For example, when an imaging region is a slice region (2D imaging), the slice gradient magnetic field is used to determine the direction and thickness of the slice region and the number thereof, or when the imaging region is a volume region (3D imaging), the slice gradient magnetic field is used to change the phase of the magnetic resonance signal in accordance with the position in the slice direction. Accordingly, an axis in the readout direction, an axis in the phase encoding direction, and an axis in the slice direction form a logic coordinate system for defining the slice region or the volume region as an imaging target.

The whole-body RF coil 4 is disposed on the inner periphery side of the gradient coil 2, applies an RF magnetic field to the subject S placed in the imaging space, and receives a magnetic resonance signal generated from the subject S due to influence of the RF magnetic field. Specifically, the whole-body RF coil 4 is formed in a hollow substantially cylindrical shape (including that having an elliptical sectional shape orthogonal to the central axis) and applies an RF magnetic field to the subject S placed in the imaging space positioned on the inner periphery side thereof based on an RF pulse signal supplied from the transmitter circuitry 6. The whole-body RF coil 4 receives a magnetic resonance signal generated from the subject S due to influence of the RF magnetic field and outputs the received magnetic resonance signal to the receiver circuitry 7.

The local RF coil 5 receives a magnetic resonance signal generated from the subject S. Specifically, the local RF coil 5 is prepared for each site of the subject S and placed near the surface of a site as an imaging target when imaging of the subject S is performed. Then, the local RF coil 5 receives a magnetic resonance signal generated from the subject S due to influence of the RF magnetic field applied by the whole-body RF coil 4, and outputs the received magnetic resonance signal to the receiver circuitry 7. The local RF coil 5 may further have a function to apply a RF magnetic field to the subject S. In this case, the local RF coil 5 is connected with the transmitter circuitry 6 and applies a RF magnetic field to the subject S based on an RF pulse signal supplied from the transmitter circuitry 6. For example, the local RF coil 5 is a surface coil or a phased array coil formed by combining a plurality of surface coils as coil elements.

The transmitter circuitry 6 outputs, to the whole-body RF coil 4, an RF pulse signal corresponding to the Larmor frequency unique to a target atomic nucleus placed in the static magnetic field. Specifically, the transmitter circuitry 6 includes a pulse generator, an RF generator, a modulator, and an amplifier. The pulse generator generates the waveform of an RF pulse signal. The RF generator generates an RF signal at a resonance frequency. The modulator generates an RF pulse signal by modulating the amplitude of the RF signal generated by the RF generator with the waveform generated by the pulse generator. The amplifier amplifies the RF pulse signal generated by the modulator and outputs the amplified RF pulse signal to the whole-body RF coil 4.

The receiver circuitry 7 generates magnetic resonance data based on the magnetic resonance signal output from the whole-body RF coil 4 or the local RF coil 5 and outputs the generated magnetic resonance data to the processing circuitry 15. For example, the receiver circuitry 7 includes a selector, a preamplifier, a phase wave detector, and an analog/digital (A/D) converter. The selector selectively inputs the magnetic resonance signal output from the whole-body RF coil 4 or the local RF coil 5. The preamplifier performs electrical-power amplification of the magnetic resonance signal output from the selector. The phase wave detector detects the phase of the magnetic resonance signal output from the preamplifier. The A/D converter generates magnetic resonance data by converting an analog signal output from the phase wave detector into a digital signal and outputs the generated magnetic resonance data to the processing circuitry 15. Not all processing described above as processing performed by the receiver circuitry 7 necessarily needs to be performed by the receiver circuitry 7, and part of the processing (for example, processing by the A/D converter) may be performed by the whole-body RF coil 4 or the local RF coil 5.

The RF shield 8 is disposed between the gradient coil 2 and the whole-body RF coil 4 to shield the gradient coil 2 from the RF magnetic field generated by the whole-body RF coil 4. Specifically, the RF shield 8 is formed in a hollow substantially cylindrical shape (including that having an elliptical sectional shape orthogonal to the central axis of a cylinder) and disposed in a space on the inner periphery side of the gradient coil 2 to cover the outer peripheral surface of the whole-body RF coil 4.

The mount 9 includes a bore 9a formed in a hollow substantially cylindrical shape (including that having an elliptical sectional shape orthogonal to the central axis) and houses the static magnetic field magnet 1, the gradient coil 2, the whole-body RF coil 4, and the RF shield 8. Specifically, the mount 9 houses the whole-body RF coil 4 being disposed on the outer periphery side of the bore 9a, the RF shield 8 being disposed on the outer periphery side of the whole-body RF coil 4, the gradient coil 2 being disposed on the outer periphery side of the RF shield 8, and the static magnetic field magnet 1 being disposed on the outer periphery side of the gradient coil 2. A space in the bore 9a included in the mount 9 is an imaging space in which the subject S is disposed at imaging.

The couch 10 includes a couchtop 10a on which the subject S is placed, and moves, to the imaging space, the couchtop 10a on which the subject S is placed when imaging of the subject S is performed. For example, the couch 10 is installed so that the longitudinal direction of the couchtop 10a is parallel to the central axis of the static magnetic field magnet 1.

In this example, the MRI apparatus 100 has what is called a tunnel structure in which the static magnetic field magnet 1, the gradient coil 2, and the whole-body RF coil 4 are formed in substantially cylindrical shapes, but the embodiment is not limited thereto. For example, the MRI apparatus 100 may have what is called an open structure in which each pair of a pair of static magnetic field magnets, a pair of gradient coils, and a pair of RF coils are disposed facing each other with interposed therebetween the imaging space in which the subject S is disposed. In such an open structure, a space sandwiched between each pair of the pair of static magnetic field magnets, the pair of gradient coils, and the pair of RF coils corresponds to the bore in the tunnel structure.

The interface 11 receives an operation to input various instructions and various kinds of information from an operator. Specifically, the interface 11 is connected with the processing circuitry 17, converts the input operation received from the operator into an electric signal, and outputs the electric signal to the processing circuitry 17. For example, the interface 11 is achieved by a trackball, a switch button, a mouse, a keyboard, a touch pad through which an input operation is performed upon touch on an operation surface, a touch screen as an integration of a display screen and a touch pad, a non-contact input circuitry using an optical sensor, a voice input circuitry, or the like for performing setting of an imaging condition and a region of interest (ROI) and the like. In the present specification, the interface 11 is not limited to an interface including a physical operation member such as a mouse or a keyboard. Examples of the interface 11 include an electric-signal processing circuitry configured to receive an electric signal corresponding to an input operation from an external input instrument provided separately from the apparatus and output the electric signal to a control circuitry.

The display 12 displays various kinds of information and various images. Specifically, the display 12 is connected with the processing circuitry 17, converts data of various kinds of information and various images transferred from the processing circuitry 17 into display electric signals, and outputs the display electric signals. For example, the display 12 is achieved by a liquid crystal monitor, a CRT monitor, or a touch panel.

The storage 13 stores various kinds of data and various computer programs. Specifically, the storage 13 is connected with the processing circuitries 14 to 17 to store various kinds of data and various computer programs input and output by each processing circuitry. For example, the storage 13 is achieved by a semiconductor memory element such as a random access memory (RAM) or a flash memory, a hard disk, or an optical disk.

The processing circuitry 14 has a couch control function 14a. The couch control function 14a controls operation of the couch 10 by outputting a control electric signal to the couch 10. For example, the couch control function 14a receives an instruction to move the couchtop 10a in the longitudinal direction, the up-down direction, or the right-left direction from the operator through the interface 11, and operates a movement mechanism of the couchtop 10a included in the couch 10 to move the couchtop 10a in accordance with the received instruction.

The processing circuitry 15 has an acquisition function 15a. The acquisition function 15a acquires k-space data by executing various pulse sequences. Specifically, the acquisition function 15a executes various pulse sequences by driving the gradient magnetic field power source 3, the transmitter circuitry 6, and the receiver circuitry 7 in accordance with sequence execution data output from the processing circuitry 17. The sequence execution data indicates a pulse sequence and is information that defines a timing at which the gradient magnetic field power source 3 supplies current to the gradient coil 2, the strength of the supplied current, the timing at which the transmitter circuitry 6 supplies a high frequency pulse signal to the whole-body RF coil 4, the strength of the supplied high frequency pulse, the timing at which the receiver circuitry 7 samples the magnetic resonance signal, and the like. Then, the acquisition function 15a receives the magnetic resonance data output from the receiver circuitry 7 as a result of execution of a pulse sequence and stores the received magnetic resonance data in the storage 13. In this case, the magnetic resonance data stored in the storage 13 receives application of the position information in the readout direction, a phase encoding direction, and the slice direction by the readout gradient magnetic field, the phase encoding gradient magnetic field, and the slice gradient magnetic field described above and is stored as k-space data expressing a two-dimensional or three-dimensional k space.

The processing circuitry 16 has a reconstruction function 16a. The reconstruction function 16a reconstructs an image from k-space data acquired by the processing circuitry 15. Specifically, the reconstruction function 16a reads the k-space data acquired by the processing circuitry 15 from the storage 13 and provides reconstruction processing such as Fourier transform to the read k-space data, thereby generating a two-dimensional or three-dimensional image. Then, the reconstruction function 16a stores the generated image in the storage 13.

The processing circuitry 17 has an imaging control function 17a. The imaging control function 17a performs entire control of the MRI apparatus 100 by controlling each component included in the MRI apparatus 100. Specifically, the imaging control function 17a displays, on the display 12, a graphical user interface (GUI) for receiving, from the operator, an operation to input various instructions and various kinds of information, and controls each component included in the MRI apparatus 100 in accordance with an input operation received through the interface 11. For example, the imaging control function 17a generates sequence execution data based on an imaging condition input by the operator, and outputs the generated sequence execution data to the processing circuitry 15 to acquire k-space data. For example, the imaging control function 17a controls the processing circuitry 16 to reconstruct an image from the k-space data acquired by the processing circuitry 15. For example, in accordance with a request from the operator, the imaging control function 17a reads an image from the storage 13 and displays the read image on the display 12.

The exemplary configuration of the MRI apparatus 100 according to the present embodiment is described above. With such a configuration, the MRI apparatus 100 according to the present embodiment has a function to produce a moving image.

For example, a method of continuously acquiring k-space data in the time direction and reconstructing an image of one frame for each predetermined number of readouts by using the acquired k-space data is known as a method of producing a moving image through the MRI apparatus 100.

Figure 2:
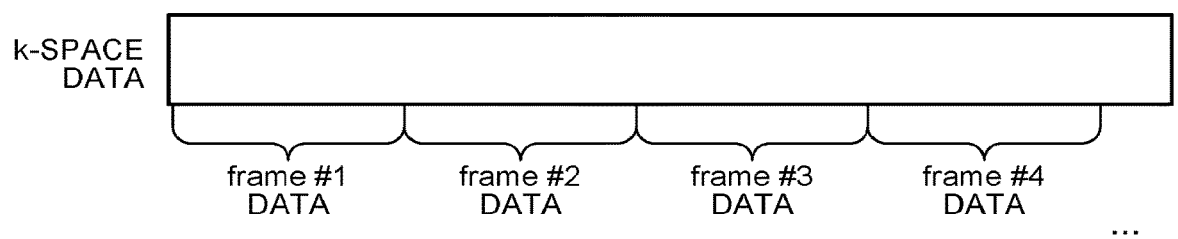
FIG. 2 is a diagram illustrating an exemplary reconstruction method according to a comparative example of the present embodiment.

FIG. 2 is a diagram illustrating an exemplary reconstruction method according to a comparative example of the present embodiment.

For example, in this method, as illustrated in FIG. 2, k-space data is continuously acquired in the time direction (direction from left to right in FIG. 2), and at each predetermined number of readouts, an image of one frame is reconstructed from the k-space data for the number of readouts. Accordingly, images of a plurality of temporally sequential frames are obtained (frame #1 data, frame #2 data, frame #3 data, frame #4 data, . . . illustrated in FIG. 2).

In this method, the image quality of a reconstructed image can be improved by increasing the number of readouts serving as the unit of image reconstruction, but a larger number of pieces of k-space data are needed to maintain the number of frames, which causes a problem such as an increased imaging time.

To avoid this, a technology called a time-domain constraint is known as a method of improving the image quality of a reconstructed image without increasing the number of readouts serving as the unit of image reconstruction. The time-domain constraint is a technology of removing noise in the time direction by adapting reconstructed temporally sequential images to prior knowledge in the time direction. For example, a method using compression sensing is known as an exemplary time-domain constraint.

However, since the time-domain constraint is processing performed on a reconstructed image, the image quality cannot be sufficiently improved sometimes when the amount of k-space data allocated to an image of one frame is small.

Thus, in the present embodiment, a method called View Sharing is used in addition to the time-domain constraint, thereby further improving the image quality of a reconstructed image.

The View Sharing is a method in which, when images of a plurality of frames are to be reconstructed from a plurality of pieces of k-space data acquired in the time direction, part of the k-space data is shared between continuous frames to reconstruct an image of each frame. With the View Sharing, the amount of k-space data allocated to an image of one frame increases, thereby improving the image quality of a reconstructed image.

In this manner, the time-domain constraint and the View Sharing are methods for improving the image quality of a reconstructed image, and it is typically thought that the same effect can be obtained by each method. However, since the time-domain constraint is processing performed on a reconstructed image whereas the View Sharing is processing performed on k-space data, image quality improvement achieved by any one of the methods is thought to be limited.

From such a viewpoint, the present embodiment uses both the View Sharing, which is performed on k-space data, and the time-domain constraint, which is performed on a reconstructed image, to achieve further improvement of the image quality of a reconstructed image.

The configuration of the MRI apparatus 100 according to the present embodiment will be described below in detail. The present embodiment describes an example in which imaging is performed by parallel imaging in which imaging is performed by using an RF coil including a plurality of coil elements.

First, in the present embodiment, the acquisition function 15a of the processing circuitry 15 continuously acquires a plurality of pieces of k-space data in the time direction. For example, the acquisition function 15a acquires a plurality of pieces of k-space data through radial acquisition in which data acquisition of acquiring k-space data of one readout along a line passing through the center of the k space is continuously performed while the angle of the line is changed. Alternatively, for example, the acquisition function 15a acquires a plurality of pieces of k-space data through Cartesian acquisition in which the number of times of acquisition in a region out of a central region is reduced by time-resolved imaging of contrast kinetics (TRICKS), time-resolved angiography with interleaved stochastic trajectories (TWIST), or differential sub-sampling with Cartesian ordering (DISCO). Alternatively, for example, the acquisition function 15a acquires a plurality of pieces of k-space data through variable density spiral acquisition in which acquisition is started at the center of the k-space and performed at a lowered acquisition density at a positioned farther away from a central region, while changing, at each readout, the angle of the readout direction at the start.

Then, in the present embodiment, the reconstruction function 16a of the processing circuitry 16 reconstructs at least one image from a plurality of pieces of k-space data acquired in the time direction by the acquisition function 15a. The reconstruction function 16a is an exemplary reconstruction unit.

Specifically, in the present embodiment, the reconstruction function 16a performs image estimation calculation that reconstructs estimated images sharing k-space data in the time direction, and adaptation calculation that adapts the estimated images to prior knowledge in the time direction. In other words, the reconstruction function 16a performs the image estimation calculation corresponding to the View Sharing, and the adaptation calculation corresponding to the time-domain constraint.

The image estimation calculation and the adaptation calculation are each calculation that optimizes estimated images. In the present embodiment, the reconstruction function 16a alternately executes the image estimation calculation and the adaptation calculation described above, thereby finally reconstructing an image.

In one example of the present embodiment, when parallel imaging and compression sensing are both used, repetitive calculation of alternate optimization is performed by using an alternating direction method of multipliers (ADMM) for an optimization problem that minimizes an objective function $E(x, z)$ indicated in in Expressions (1) and (2) below, thereby finally reconstructing an image x.

$$E(x,z)=\|FSx-y\|_2^2+\lambda R(z,y) \, s.t. \, x-z=0 \tag{1}$$

$$\text{image } x:E(x,z) \to \min \tag{2}$$

In the above expressions, y represents k-space data used for reconstruction of the image x, and z represents an auxiliary variable. In addition, $\|FSx-y\|_2^2$ represents the image estimation calculation that reconstructs an estimated image per frame by the parallel imaging, F represents Fourier transform, and S represents coil sensitivity of a coil element. In addition, $R(z, y)$ represents the adaptation calculation that performs the time-domain constraint by the compression sensing, and $\lambda$ represents the magnitude of weighting of the adaptation calculation relative to the image estimation calculation. The function $R(z, y)$ derives an index value indicating the degree of difference between the image x and an image including no noise in the time direction, and the smaller index value indicates that the image x is more adapted to a plurality of images including no noise.

In another exemplary of the present embodiment, the reconstruction function 16a may reconstruct an image by using a pre-trained model produced by incorporating such repetitive calculation of alternate optimization using the ADMM in a deep neural network (DNN) and performing machine learning. Such a learning-completed model may be produced by, for example, a method written in Deep ADMM-Net for Compressive Sensing MRI (Y. Yang et al. Deep ADMM-Net for Compressive Sensing MRI. In Proceedings of Advances in Neural Information Processing Systems. 2016; 29: 10-18).

The learning-completed model is produced by, for example, machine learning that uses, as learning data, a plurality of pieces of k-space data acquired in the time direction and a plurality of images not including noise in the time direction. Accordingly, for example, a model that, upon inputting of k-space data y, outputs the image x minimizing $E(x, z)$ is generated as the learning-completed model.

Then, in the present embodiment, the reconstruction function 16a reconstructs a plurality of temporally sequential estimated images by applying the View Sharing to the above-described repetitive calculation of alternate optimization using the ADMM or the image reconstruction using the learning-completed model.

Figure 3:
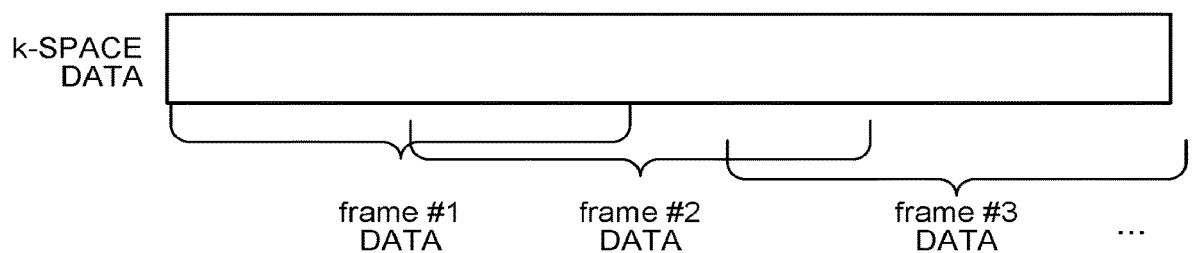
FIG. 3 is a diagram illustrating an exemplary reconstruction method performed by a reconstruction function according to the present embodiment.

FIG. 3 is a diagram illustrating an exemplary reconstruction method performed by the reconstruction function 16a according to the present embodiment.

For example, as illustrated in FIG. 3, the reconstruction function 16a uses k-space data continuously acquired in the time direction (direction from left to right in FIG. 3) by the acquisition function 15a, and at each predetermined number of readouts, and inputs the k-space data to the repetitive calculation of alternate optimization using the ADMM or the learning-completed model described above, thereby reconstructing an estimated image of one frame from the k-space data for the number of readouts. In this case, the reconstruction function 16a reconstructs an estimated image of each frame by the image estimation calculation with part of the k-space data being shared between continuous frames. Accordingly, estimated images of a plurality of temporally sequential frames are obtained (frame #1 data, frame #2 data, frame #3 data, . . . illustrated in FIG. 3).

In this manner, in the present embodiment, the reconstruction function 16a alternately executes the image estimation calculation and the adaptation calculation by utilizing knowledge used in, for example, the compression sensing, and the learning-completed model produced by machine learning such as the DNN, thereby finally reconstructing an image. For example, the reconstruction function 16a repeats sequential execution of the image estimation calculation and the adaptation calculation by using the learning-completed model until a predetermined end condition is satisfied. In this case, for example, the reconstruction function 16a determines that the end condition is satisfied when the change amount of $E(x)$ is smaller than a predetermined threshold value, or determines that the end condition is not satisfied when the change amount of $E(x)$ is not smaller than the predetermined threshold value. Alternatively, for example, the reconstruction function 16a determines that the end condition is satisfied when the number of times of execution of the image estimation calculation and the adaptation calculation has reached a predetermined upper limit value, or determines that the end condition is not satisfied when the number of times of execution has not reached the predetermined upper limit value.

Then, the reconstruction function 16a outputs, to the display 12 as a definitive image, an estimated image derived last as a result of alternate execution of the image estimation calculation and the adaptation calculation.

The processing functions of the processing circuitries 14 to 17 are described above, and for example, each processing circuitry is achieved by a processor. In this case, the processing function of each processing circuitry is stored in the storage 13, for example, in the form of computer-executable program. Then, each processing circuitry reads the corresponding computer program from the storage 13 and executes the computer program, thereby achieving the processing function corresponding to the computer program. In other words, each processing circuitry having read the corresponding computer program has a function indicated in the processing circuitry in FIG. 1.

Although it is assumed in the description that each processing circuitry is achieved by one processor, the embodiment is not limited thereto and each processing circuitry may be configured as a combination of a plurality of independent processors, and each processor may execute a computer program to achieve a processing function. The processing functions of the processing circuitries may be distributed or integrated to one or a plurality of processing circuitries as appropriate and achieved. In addition, although one storage 13 stores a computer program corresponding to each processing function in the example illustrated in FIG. 1, a plurality of storages may be distributed so that each processing circuitry reads the corresponding computer program from an individual storage.

FIG. 4 is a flowchart illustrating the procedure of imaging processing performed by the MRI apparatus 100 according to the present embodiment.

For example, as illustrated in FIG. 4, in the present embodiment, the following processing is started when the imaging control function 17a has received an instruction to start imaging from the operator (Yes at step S101).

First, the acquisition function 15a acquires a plurality of pieces of k-space data continuously in the time direction (step S102). For example, the acquisition function 15a acquires a plurality of pieces of k-space data by any of the radial acquisition, the Cartesian acquisition, and the spiral acquisition.

Thereafter, the reconstruction function 16a estimates the coil sensitivity based on the k-space data acquired by the acquisition function 15a (step S103). For example, the reconstruction function 16a reconstructs, for each coil element of an RF coil used for imaging, one image from all acquired k-space data and measures the coil sensitivity based on the luminance value of the image.

Thereafter, the reconstruction function 16a executes the image estimation calculation by using the acquired k-space data and the measured coil sensitivity (step S104), and further executes the adaptation calculation by using an estimated image reconstructed by the image estimation calculation (step S105).

The reconstruction function 16a alternately executes the image estimation calculation and the adaptation calculation by repeatedly executing the image estimation calculation and the adaptation calculation until a predetermined end condition is satisfied (No at step S106). The processing of the adaptation calculation in this alternate optimization may utilize, for example, knowledge used in the compression sensing or may utilize the learning-completed model produced by machine learning such as the DNN.

Then, when the predetermined end condition is satisfied (No at step S106), the reconstruction function 16a outputs an estimated image derived last to the display 12 as a definitive image (step S107).

For example, the processing at step S101 in the processing procedure illustrated in FIG. 4 is achieved when the processing circuitry 17 reads a predetermined computer program corresponding to the imaging control function 17a from the storage 13 and executes the computer program. For example, the processing at step S102 is achieved when the processing circuitry 15 reads a predetermined computer program corresponding to the acquisition function 15a from the storage 13 and executes the computer program. For example, the processing at steps S103 to S106 is achieved when the processing circuitry 16 reads a predetermined computer program corresponding to the reconstruction function 16a from the storage 13 and executes the computer program.

Since the image estimation calculation and the adaptation calculation are sequentially executed in the above-described processing procedure, a definitive image is an estimated image derived by the adaptation calculation, but the embodiment is not limited thereto. For example, the reconstruction function 16a may set, as a definitive image, an estimated image reconstructed last by the image estimation calculation when a predetermined end condition is satisfied.

As described above, in the present embodiment, the reconstruction function 16a performs the image estimation calculation that reconstructs estimated images sharing k-space data in the time direction, and the adaptation calculation that adapts the estimated images to prior knowledge in the time direction.

In this manner, in the present embodiment, a method called the View Sharing is used in addition to the time-domain constraint, and thus the image quality of a reconstructed image can be further improved. In addition, the image quality for the frame rate at moving imaging can be improved.

Although the MRI apparatus 100 according to the present embodiment is described above, the embodiment of a technology disclosed by the present application is not limited thereto. Modifications of the above-described embodiment will be described below.

For example, the above embodiment describes an example in which the reconstruction function 16a reconstructs an image by using prior knowledge based on deep learning, but the embodiment is not limited thereto. For example, the reconstruction function 16a may reconstruct an image by using prior knowledge based on singular value decomposition (SVD), principal component analysis (PCA), or the like.

The above embodiment describes an example in which the reconstruction function 16a performs the adaptation calculation that adapts an estimated image to prior knowledge in the time direction, but the embodiment is not limited thereto. For example, the prior knowledge used in the adaptation calculation may further include contents in the spatial direction. Specifically, the reconstruction function 16a performs the adaptation calculation that adapts an estimated image to prior knowledge in the time direction and the spatial direction. In this case, the prior knowledge may be based on the deep learning, the compression sensing, the singular value decomposition, the principal component analysis, or the like.

The above embodiment describes an example in which the reconstruction function 16a alternately executes the image estimation calculation and the adaptation calculation, but the embodiment is not limited thereto. For example, the reconstruction function 16a may simultaneously execute the image estimation calculation and the adaptation calculation. In this case, well-known various non-linear optimization methods may be used. For example, a non-linear optimization method disclosed at https://jp.mathworks.com/help/optim/ug/solve-constrained-nonlinear-optimization-problem-based.html may be used.

The above embodiment describes an example in which the image estimation calculation is calculation that reconstructs an estimated image by the parallel imaging, but the embodiment is not limited thereto. For example, when imaging using one RF coil is performed, the image estimation calculation may be calculation that reconstructs an estimated image from k-space data acquired by the one RF coil. Specifically, in this case, the image estimation calculation is calculation of Expression (1) except for the coil sensitivity S in the first term.

In the above-described embodiment, when reconstructing estimated images of frames while part of k-space data is shared between continuous frames, the reconstruction function 16a may perform weighting on the shared k-space data.

For example, the reconstruction function 16a reduces a weight of a signal included in a central part of the k space in the shared k-space data as compared to that of a signal included in a peripheral part, and reconstructs an estimated image of each frame. Normally, in k-space data, a signal included in the central part of the k space is larger than a signal included in the peripheral part. Thus, when the weight of a signal included in the central part of the k space is reduced, influence of k-space data sharing on an image can be reduced.

The above embodiment describes an example in which the acquisition function 15a acquires a plurality of pieces of k-space data by the radial acquisition, but the embodiment is not limited thereto. For example, the acquisition function 15a may acquire k-space data by the Cartesian acquisition, the spiral acquisition, or the like.

The above embodiment describes an example in which the reconstruction function 16a reconstructs estimated images by the same reconstruction method for all frames, but the embodiment is not limited thereto.

For example, the reconstruction function 16a may change, for each frame as appropriate, the number of readouts allocated to reconstruction of an estimated image of one frame instead of reconstructing, for all frames, estimated images from k-space data for the same number of readouts.

For example, instead of reconstructing estimated images by using the View Sharing for all frames, the reconstruction function 16a may reconstruct estimated images of some frames by using the View Sharing and reconstruct estimated images of the other frames by using a reconstruction method in which the k space is not shared. Specifically, when an estimated image of at least one frame is reconstructed by using the View Sharing, the image quality is improved as compared to a case in which the View Sharing is not used at all.

For example, instead of reconstructing estimated images of all frames by the parallel imaging, the reconstruction function 16a may reconstruct estimated images of some frames by using k-space data acquired by all coil elements and reconstruct estimated images of the other frames by using k-space data acquired by some coil elements.

The above embodiment describes an example in which the reconstruction function 16a uses the same time-domain constraint for all frames, but the embodiment is not limited thereto.

For example, when the number of images input to a denoising function R(x, y) based on deep learning is limited to a predetermined number, the reconstruction function 16a may perform the time-domain constraint by using other prior knowledge such as compression sensing for a plurality of first frames and a plurality of last frames with which the predetermined number is not reached among all frames, and perform the time-domain constraint by using R(x, y) for the plurality of other frames.

The above embodiment describes an example in which the reconstruction unit in the present specification is achieved by the reconstruction function 16a of the processing circuitry 16, but the embodiment is not limited thereto. For example, instead of being achieved by the reconstruction function 16a described in the embodiment, the function of the reconstruction unit in the present specification may be achieved only by hardware, only by software, or by a mixture of hardware and software.

The term "processor" used in the above description means, for example, a central processing unit (CPU), a graphics processing unit (GPU), or a circuit such as application specific integrated circuit (ASIC) or a programmable logic device (for example, a simple programmable logic device (SPLD), a complex programmable logic device (CPLD), or a field programmable gate array (FPGA)). The processor achieves a function by reading and executing a computer program stored in a storage. The computer program may be directly incorporated in a circuit of the processor instead of being stored in the storage. In this case, the processor achieves the function by reading and executing the computer program incorporated in the circuit. The processor of the present embodiment does not necessarily need to be configured as one circuit but may be configured as one processor by combining a plurality of independent circuits to achieve the corresponding function.

The computer program executed by the processor is incorporated in a read only memory (ROM), a storage, or the like in advance and provided. The computer program may be recorded and provided on a computer-readable storage medium such as a compact disc (CD)-ROM, a flexible disk (FD), CD-Recordable (R), or a digital versatile disc (DVD) as a file in a format that is installable or executable on these devices. The computer program may be stored in a computer connected with a network such as the Internet and provided or distributed by downloading through the network. For example, the computer program is configured as a module including each above-described functional component. Each module is loaded onto a main storage device and generated on the main storage device when a CPU reads the computer program from a storage medium such as a ROM and executes the computer program in an actual hardware configuration.

According to the above-described at least one embodiment, the image quality of a reconstructed image can be further improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image reconstruction apparatus, comprising:
processing circuitry configured to reconstruct at least one image from a plurality of pieces of k-space data acquired in a time direction, wherein the processing circuitry is further configured to perform
an image estimation calculation that reconstructs temporally sequential estimated images sharing the k-space data in the time direction, and
an adaptation calculation that adapts the temporally sequential estimated images reconstructed by the image estimation calculation to prior knowledge in the time direction.

2. The image reconstruction apparatus according to claim 1, wherein the prior knowledge used in the adaptation calculation by the processing circuitry further includes contents in a spatial direction.

3. The image reconstruction apparatus according to claim 1, wherein the processing circuitry is further configured to reconstruct the image by using the prior knowledge, which is based on deep learning, compression sensing, singular value decomposition, or principal component analysis.

4. The image reconstruction apparatus according to claim 1, wherein
the image estimation calculation and the adaptation calculation are each a calculation that optimizes the temporally sequential estimated images, and
the processing circuitry is further configured to alternately execute the image estimation calculation and the adaptation calculation.

5. The image reconstruction apparatus according to claim 1, wherein
the image estimation calculation and the adaptation calculation are each a calculation that optimizes the temporally sequential estimated images, and
the processing circuitry is further configured to simultaneously execute the image estimation calculation and the adaptation calculation.

6. The image reconstruction apparatus according to claim 1, wherein the image estimation calculation is a calculation that reconstructs the temporally sequential estimated images by parallel imaging.

* * * * *